United States Patent
Park

(10) Patent No.: US 7,087,519 B2
(45) Date of Patent: Aug. 8, 2006

(54) METHOD FOR FORMING CONTACT HAVING LOW RESISTIVITY USING POROUS PLUG AND METHOD FOR FORMING SEMICONDUCTOR DEVICES USING THE SAME

(75) Inventor: Hee-Sook Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 114 days.

(21) Appl. No.: 10/895,190

(22) Filed: Jul. 19, 2004

(65) Prior Publication Data

US 2005/0054183 A1   Mar. 10, 2005

Related U.S. Application Data

(62) Division of application No. 10/103,942, filed on Mar. 22, 2002, now abandoned.

(30) Foreign Application Priority Data

Mar. 23, 2001 (KR) .................................. 01-15248

(51) Int. Cl.
*H01L 21/4763* (2006.01)

(52) U.S. Cl. .................... 438/637; 257/68; 257/296; 257/E29.111; 438/238; 438/680; 438/381

(58) Field of Classification Search ............... 438/637, 438/238, 381, 680, 692, 643, 653, 675, 712, 438/722, 723, 682, 683, 655, 656, 743, 744, 438/706, 745, 738, 754, 782, 783
See application file for complete search history.

(56) References Cited

U.S. PATENT DOCUMENTS

| 5,705,430 | A | * | 1/1998 | Avanzino et al. ............ 438/618 |
| 5,895,239 | A | * | 4/1999 | Jeng et al. ................... 438/239 |
| 6,057,239 | A |   | 5/2000 | Wang et al. ................. 438/700 |
| 6,143,604 | A | * | 11/2000 | Chiang et al. .............. 438/253 |
| 6,297,149 | B1 |  | 10/2001 | Stamper ....................... 438/637 |
| 6,372,616 | B1 |  | 4/2002 | Yoo et al. .................... 438/592 |
| 6,836,019 | B1 | * | 12/2004 | Yang et al. .................. 257/774 |

FOREIGN PATENT DOCUMENTS

KR    01-15248    3/2001

* cited by examiner

*Primary Examiner*—David Nhu
(74) *Attorney, Agent, or Firm*—Marger Johnson & McCollom, P.C.

(57) ABSTRACT

A method for forming a contact of a semiconductor device is disclosed. A first interlevel dielectric (ILD) layer is formed on a conductive region, e.g., an active region. The first ILD layer is etched to form a first contact hole therein to expose the conductive region. The first contact hole is filled with a porous layer having a high etch selectivity with respect to the first ILD layer to form a porous plug therein. Next, a second ILD layer is formed overlying the porous plug. The second ILD layer is etched to form a second contact hole therein to expose the porous plug. The porous plug in the first contact hole is removed. The first and second contact holes are filled with a conductive material to form a contact plug. During this contact formation process, the active region or the conductive region of the semiconductor substrate can be protected with the porous plug. Thus, the electrical characteristics degradation caused by dopant diffusion resulting from a thermal process during contact formation can be avoided.

30 Claims, 13 Drawing Sheets

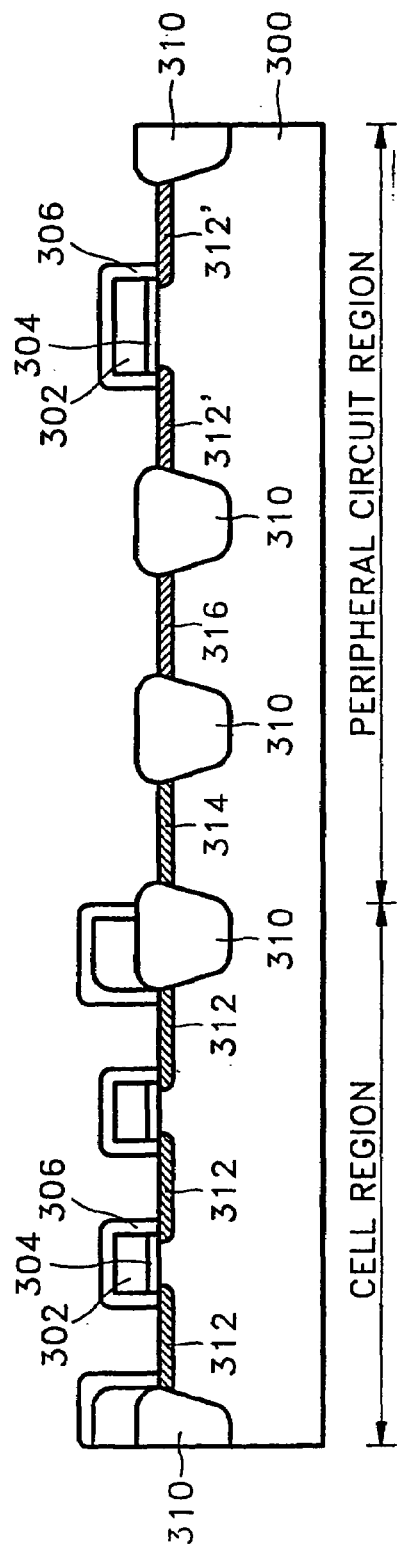
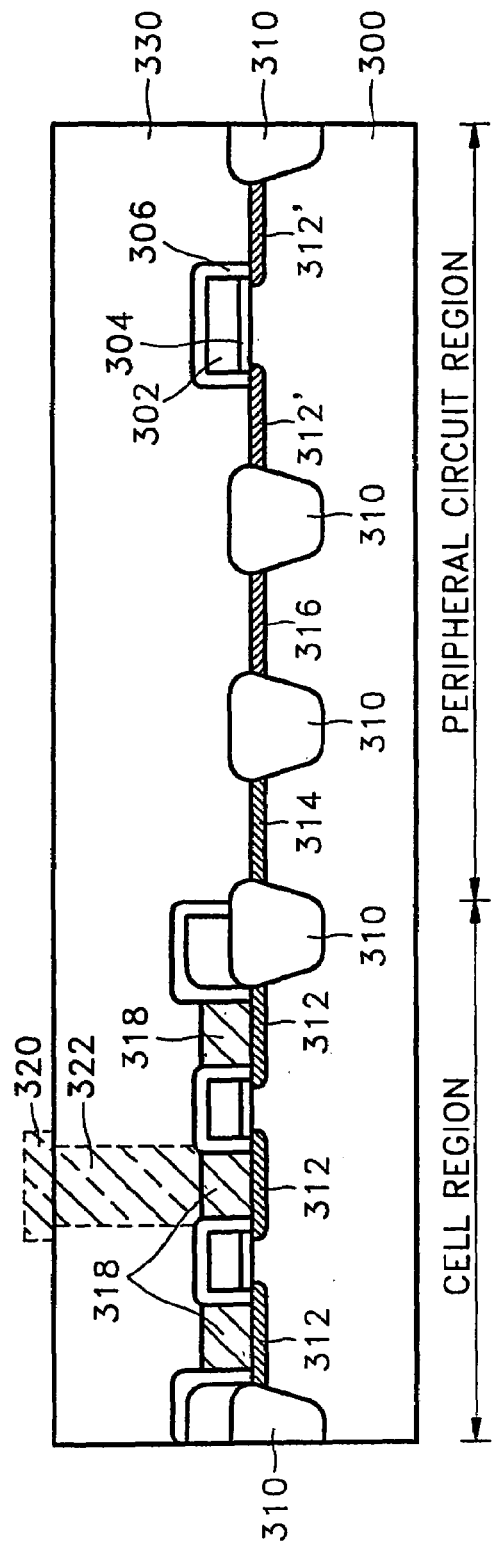

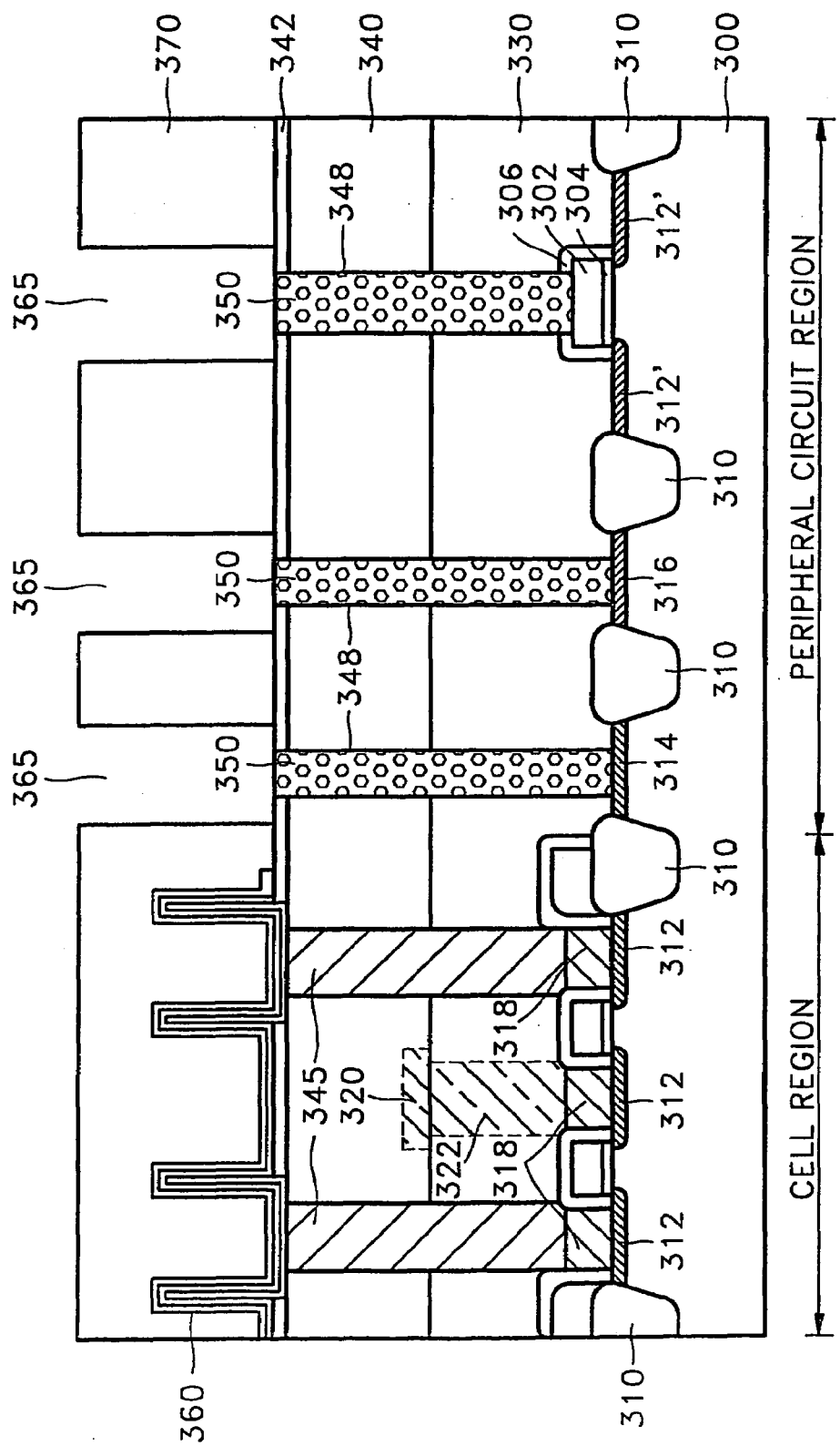

METHOD FOR FORMING CONTACT HAVING LOW RESISTIVITY USING POROUS PLUG AND METHOD FOR FORMING SEMICONDUCTOR DEVICES USING THE SAME

This application is a divisional of U.S. Pat. No. 10,103,942, filed on Mar. 22, 2002, now abandoned, which is herein incorporated by reference in its entirety.

BACKGROUND OF THE INVENTION

1. Field of the Invention

The present invention relates to a method for manufacturing a semiconductor device and, more particularly, to a method for forming a contact of a semiconductor memory device and method for forming a semiconductor device using the same.

2. Description of the Related Art

As semiconductor memory devices become highly integrated, it becomes more difficult to provide interconnections therein. Specifically, a voltage must be applied to a gate electrode, a source/drain, and a bulk substrate to drive a transistor. To realize this, a contact hole must be formed in each terminal, and metal interconnections are also required.

However, along with an increase in the integration density of the semiconductor memory devices, the design rule decreases, and the size of the contact hole becomes smaller. In particular, in case of a semiconductor memory device having a stack-type capacitor, as the size of the chip is reduced, the height of the capacitor is inevitably increased. The depth of the contact hole is also increased. As a result, the contact hole is incompletely formed, or the contact resistance increases.

One conventional approach to overcome this problem is to employ a two-step process to form a contact connected to active regions of a semiconductor substrate. This conventional method for forming a contact will be described with reference to FIGS. 1A through 1C.

First, referring to FIG. 1A, a first interlevel dielectric (ILD) layer 110 is formed on a semiconductor substrate 100. Then, a first contact hole 112 for opening an active region 102 of the semiconductor substrate 100 is formed.

Next, referring to FIG. 1B, a lower contact plug 114 is formed by filling the first contact hole 112 with a conductive material. Subsequently, a second ILD layer 120 is formed on the first ILD layer 110 and on the lower contact plug 114. The second ILD layer 120 is etched to form a second contact hole 122 for opening the lower contact plug 114.

Next, referring to FIG. 1C, an upper contact plug 130 is formed by filling the second contact hole 122 with a conductive material, thereby forming contact plugs 114 and 130 for connecting a metal interconnection (not shown) on the second ILD layer 120 to the active region 102 on the semiconductor substrate 100.

However, this method for forming a contact has several drawbacks such as ones described below. Although not shown, semiconductor devices such as a capacitor, a bit line contact, and a contact for forming a capacitor, are formed in the first and second ILD layers 110 and 120, and thermal processes with a long processing time is required during the fabrication of a contact. One example of such thermal processes is an annealing process for activating dopants. Another example is an annealing process performed during the deposition of a capacitor dielectric layer, in the case of using a doped polysilicon as a contact material for forming a contact connected to a capacitor electrode. As a result, dopants from the active region 102 of the semiconductor substrate 100, especially, p-type dopants, are diffused and escape through the lower contact plug 114. This significantly deteriorates the electrical characteristics of the active region 102, i.e., a transistor. This phenomenon becomes severe when the contact plug is formed of a metal. Furthermore, diffusion of dopants occurs more remarkably when an ohmic layer (not shown) formed of silicide is interposed between the active region and the contact plug.

Each memory block forming a memory device in a semiconductor memory device can be divided into a cell region and a peripheral circuit region. In general, dopants must be doped onto an active region of the cell region and onto an active region of the peripheral circuit region. Thus, if the contact is formed on the active region of the peripheral circuit region, there is a significant deterioration of the electrical characteristics caused by the diffusion of dopants. If a thermal process at a temperature of greater than 650° C. with a long processing time is performed during the formation of a device of the cell region during the formation of the contact of the peripheral circuit region, the contact resistance greatly increases and this makes it almost impossible to form the proper contact.

SUMMARY OF THE INVENTION

To solve the above problems, the present invention provides a method for forming a contact in which the electrical characteristics of a contact is not deteriorated by a thermal process during contact formation.

The present invention also provides a method for forming a semiconductor device, using the method for forming a contact.

In accordance with an embodiment of the present invention, a first interlevel dielectric (ILD) layer is formed on a semiconductor substrate. The first ILD layer is etched to form a first contact hole to expose an active region of the semiconductor substrate. The first contact hole filled with a porous layer such as a porous oxide layer having a high etch selectivity with respect to the first ILD layer to form a porous plug such as a porous oxide plug. A second ILD layer is formed on the semiconductor substrate on which the porous oxide plug is formed. The second ILD layer is etched to form a second contact hole to expose an upper portion of the filled first contact hole. The porous oxide layer filled in the first contact hole is removed, and the first and second contact holes are filled with a conductive material to form a contact plug.

In accordance with another embodiment of the present invention, a cell region and a peripheral circuit region are defined by a field oxide layer and an active region on a semiconductor substrate. A transistor is formed on active regions of the cell region and the peripheral circuit region. A first interlevel dielectric (ILD) layer is formed on the semiconductor substrate on which the transistor is formed. A bit line and a bit line contact connected to a source or drain region of the transistor formed on the cell region through the first ILD layer are formed. A second ILD layer is formed on the semiconductor substrate on which the bit line is formed. A contact for a capacitor electrode connected to the source or drain region of the transistor formed on the cell region is formed through the first and second ILD layers. A first contact hole to expose the active region of the peripheral circuit region or a gate electrode of the transistor is formed through the first and second ILD layers. The first contact hole is filled with a porous layer such as a porous oxide layer having a high etch selectivity with respect to the first and second ILD layers. A capacitor connected to the contact for a capacitor electrode is formed on the second ILD layer of the cell region. A third ILD layer is formed on the semiconductor substrate on which the capacitor is formed. A second contact hole for opening an upper portion of the first contact hole of the peripheral circuit region is formed through the third ILD layer of the peripheral circuit region. The porous layer in the exposed first contact hole is removed.

The exposed first and second contact holes are filled with a conductive material to form a contact of the peripheral circuit region.

According to yet another embodiment of the present invention, a cell region and a peripheral circuit region are defined by a field oxide layer and an active region on a semiconductor substrate. A transistor is formed on active regions of the cell region and the peripheral circuit region. A first interlevel dielectric (ILD) layer is formed on the semiconductor substrate on which the transistor is formed. A bit line contact connected to a source or drain region of the transistor formed on the cell region through the first ILD layer is formed. A first contact hole for opening the active region of the peripheral circuit region or a gate electrode of the transistor through the first ILD layer. The first contact hole is filled with a porous layer such as a porous oxide layer having a high etch selectivity with respect to the first ILD layer. A bit line connected to the bit line contact on the cell region is formed. A second ILD layer is formed on the semiconductor substrate on which the bit line is formed. A contact for forming a capacitor connected to the source or drain region of the cell region through the first and second ILD layers is formed. A capacitor connected to the contact for a capacitor is formed on the cell region. A third ILD layer is formed on the semiconductor substrate on which the capacitor is formed. A second contact hole to expose an upper portion of the first contact hole of the peripheral circuit region is formed through the second and third ILD layers of the peripheral circuit region. The porous layer in the first contact hole is removed. The first and second contact holes from which the porous layer is removed are filled with a conductive material to form a contact of the peripheral circuit region.

BRIEF DESCRIPTION OF THE DRAWINGS

The above objectives and advantages of the present invention will become more apparent by describing in detail preferred embodiments thereof with reference to the attached drawings in which:

FIGS. 4A through 4F are sectional views illustrating a method for forming a semiconductor device using the method for forming a contact, according to another embodiment of the present invention.

DETAILED DESCRIPTION OF THE INVENTION

The present invention will be described more fully hereinafter with reference to the accompanying drawings in which preferred embodiments of the invention are shown. Terms such as "first" and "second" of a first material layer or a second material layer, used in preferred embodiments to be described later, are used to classify each material layer only in one embodiment, and even though the same terms such as the first material layer or the second material layer, are used in another embodiment, this does not necessarily refer to the same material layer as with the previous embodiment.

A method for forming a contact according to one embodiment of the present invention will be described with reference to FIGS. 2A through 2F.

Figure 1A:
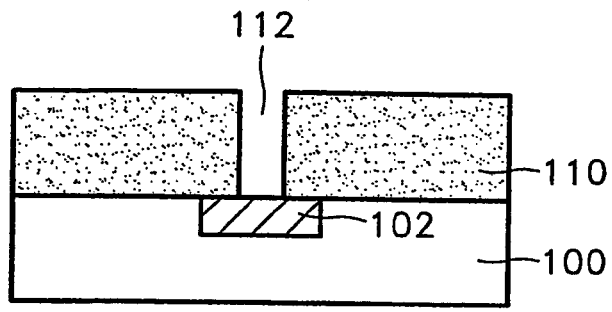
FIGS. 1A through 1C are sectional views illustrating the step of forming a contact according to the prior art.
Figure 1B:
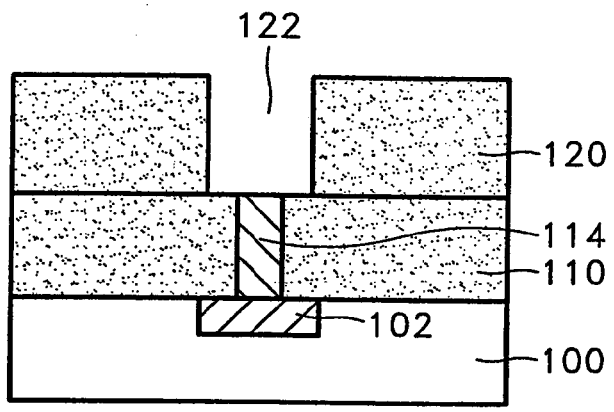
Figure 1C:
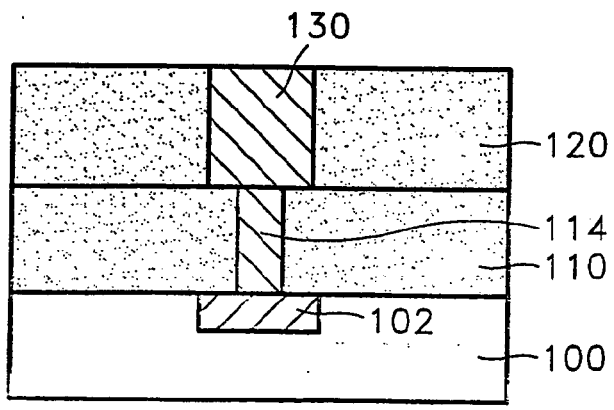
Figure 2A:
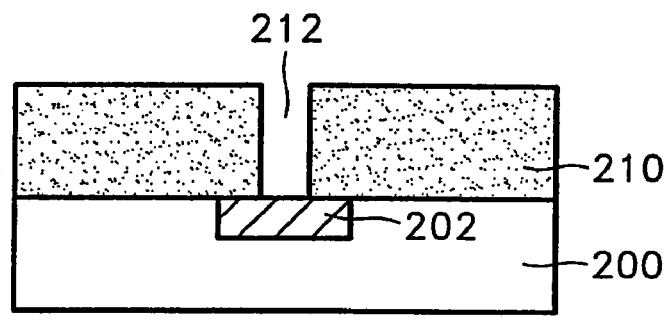
FIGS. 2A through 2F illustrate a method for forming a contact having low resistivity using a porous oxide plug according to an embodiment of the present invention.

Referring to FIG. 2A, a first interlevel dielectric (ILD) layer is formed on an active region 202 of a semiconductor substrate 200. Preferably, the first ILD layer 210 is a compact and solid oxide layer. The first ILD layer 210 may be formed by a conventional chemical vapor deposition (CVD) method, or a compact and hardened glass layer manufactured by a spin on glass (SOG) method. For example, the first ILD layer 210 may be a high-density plasma (HDP) layer, a plasma enhanced-tetraethylorthosilicate (PE-TEOS) layer, or an undoped silicate glass (USG) layer.

Referring back to FIG. 2A, the first ILD layer 210 is etched to form a first contact hole 212 to expose the active region of the semiconductor substrate 200. This processing step can be performed by a conventional photolithography and etching process. That is, a photoresist pattern (not shown) for opening a portion corresponding to the first contact hole 212 is formed on the first ILD layer 210. Then, the first ILD layer 210 is etched to form the first contact hole 212, using the photoresist pattern as an etching mask. Preferably, this etch step is performed by reactive ion etching (RIE) such that the first ILD layer 210 is selectively etched with respect to the active region 202 (doped silicon) of the semiconductor substrate 200.

Figure 2B:
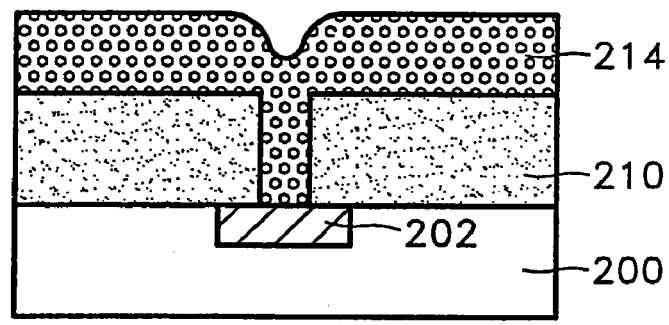

Subsequently, referring to FIG. 2B, the photoresist pattern (not shown) is removed, and a porous dielectric layer such as a porous oxide layer 214 having a high etch selectivity with respect to the first ILD layer 210 is formed on the first ILD layer 210 and within the first contact hole 212. Here, the "etch selectivity" of B to A is the ratio of etch speeds and is expressed in the ratio of an etch speed of B: an etch speed of A. "High etch selectivity" means that the etch speed of B is faster than the etch speed of A.

The porous oxide layer 214 having a high etch selectivity is used as a material for filling the first contact hole 212 so that the porous oxide layer 214 is etched faster than that of a peripheral layer such as the first ILD layer 210 and is selectively removed in a subsequent etch process. The porous oxide layer 214 can be formed by a chemical vapor deposition (CVD) method, or a spin on glass (SOG) method.

An oxide layer formed by a conventional CVD method in semiconductor processes is formed as a compact layer. However, by adjusting the deposition condition, a porous oxide layer having high porosity and small density that is appropriate for use in an oxide layer of the embodiment can be formed. That is, the density of a deposited layer can be reduced by changing the flow, pressure, and temperature of a source gas. Preferably, the CVD method for forming the porous oxide layer is performed under a pressure of 0.1–10 Torr, at a temperature of 50–600° C., and at a radio frequency (RF) power of 50–700 W. Here, tetramethyl silane (TMS), tetrafluoro silane, trimethylfluoro silane, or dimethyldifluoro silane is used as a source gas, and the flow of the source gas 1–5000 sccm, and oxygen ($O_2$) and hydrogen ($H_2$) are used as a reactive gas, and the flow of the reactive gas is 100–5000 sccm. The porous oxide layer formed by the CVD method can be formed of a material selected from the group consisting of $SiO_2$, SiOF, SiOC, and SiOCH. In particular, the oxide layer (for example, a SiOF layer, a SiOC layer, and a SiOCH layer) containing carbon (C) or fluorine (F) of the porous oxide layer has a greater porosity than that of a layer only formed of silicon dioxide ($SiO_2$).

Both organic SOG such as silane, and inorganic SOG such as silsesquioxane, hydrogen silsesquioxane can be used in the SOG method for forming a porous dielectric layer such as the porous oxide layer 314. That is, the organic SOG material such as nanoglass manufactured by Allied Signal, or SiLK manufactured by Dow Corning, can be used, and the inorganic SOG material such as XLK manufactured by Dow Corning, can be used. Spin coating is preferably performed at 1000–5000 rpm, and at room temperature. Next, a first thermal treatment of the layer coated by the SOG method is performed at a temperature of 0–100° C. for 3–10 minutes. Next, a second thermal treatment is performed so that the porous oxide layer (214 or 214') has sufficient strength to endure the stress occurring in a subsequent process. Since the strength of the glass porous oxide layer formed by the SOG method is very weak, it is preferable to undergo a hardening process as described above. The second thermal treatment can be performed by processes such as baking, rapid thermal processing (RTP), or annealing, at a temperature of 200–1000° C. For example, baking can be performed at a temperature of 200–1000° C. for 30–60 minutes, or RTP can be performed for 10 seconds to 10 minutes, or annealing can be performed for 30–60 minutes. The second thermal treatment can be performed in an atmosphere of oxygen ($O_2$) and hydrogen ($H_2$), or nitrogen ($N_2$), and also in a vacuum state. In the second thermal treatment, the porous oxide layer formed by the SOG method has a predetermined strength, impurities contained in a dispersion solvent (menstruum) are removed, or pores are easily formed. The porous oxide layer formed by the SOG method can be formed of a material selected from the group consisting of $SiO_2$, SiOC, and SiOCH.

Also, a silica gel such as xerogel or aerogel can be used as the porous oxide layer for the present invention. Here, xerogel or aerogel is a glass layer whose main component is silica ($SiO_2$), and is classified by its density. Xerogel has a density of about 0.2–1.0 g/cm3, and aerogel has a density less than 0.2 g/cm3. In view of the fact that the density of a quartz as a monocrystalline of $SiO_2$ is about 2.6, xerogel and aerogel have very high porosity, and thus are appropriate for the porous oxide layer for an embodiment of the present invention. The xerogel or aerogel can be formed by using the CVD method or SOG method.

As described above, the first ILD layer 210 formed by the conventional method is a compact and solid oxide layer, whereas the porous oxide layer of an embodiment of the present invention has high porosity. Thus, dry- or wet-etching speeds are very fast, and it is easy to selectively remove the porous oxide layer 214 in a subsequent etching process. This is because the area of the porous oxide layer 214 in contact with a chemical etchant or an etching gas is large because of the pores formed in the porous oxide layer 214. Further, if the pores create open porosity, the etchant or the etching gas can penetrate into the porous oxide layer 214 more easily, thereby improving the etching characteristics.

Figure 3A:
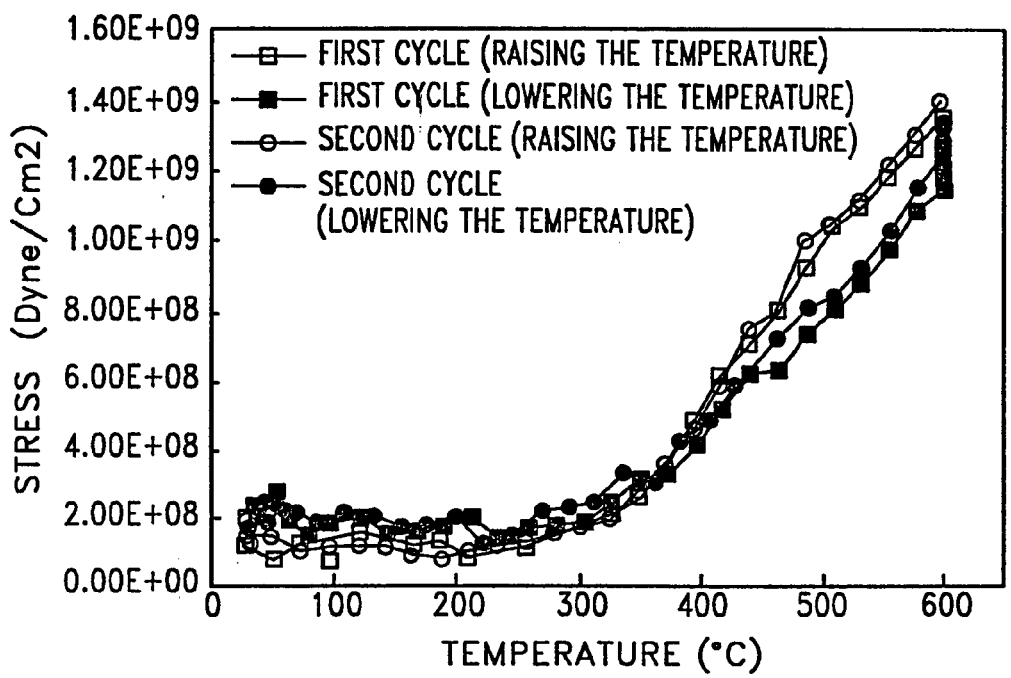
FIG. 3A is a graph illustrating a thermal stress hysteresis loop of nanoglass used in the embodiment of the present invention.
Figure 3B:
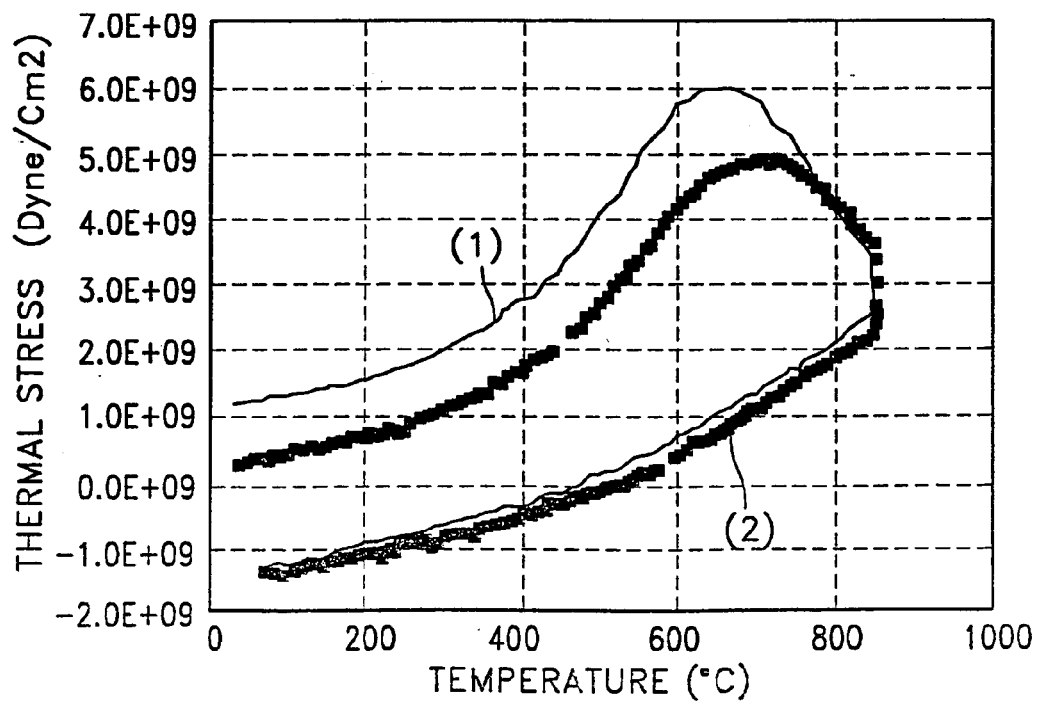
FIG. 3B is a graph illustrating a thermal stress hysteresis loop of a conventional chemical vapor deposition (CVD) oxide layer used as an interlevel dielectric (ILD) layer.

Preferably, the porous oxide layer 214 withstands thermal stress caused by frequent thermal processes performed during the conventional semiconductor fabrication processes. FIG. 3A is a graph illustrating a thermal stress hysteresis loop of nanoglass as one of the porous oxide layers used according to an embodiment of the present invention, and FIG. 3B is a graph illustrating a thermal stress hysteresis loop of a conventional chemical vapor deposition (CVD) oxide layer used as an interlevel dielectric (ILD) layer where (1) is a plasma-enhanced CVD oxide layer, and (2) is a high-density CVD oxide layer. The thermal hysteresis loop illustrates thermal stress occurring when repeatedly periodically raising and lowering the temperature at a predetermined temperature interval. FIGS. 3A and 3B illustrate variations in thermal stress when the processes raising the temperature and lowering the temperature of nanoglass are repeated twice at room temperature to 600° C. More specifically, the internal area of the hysteresis loop by a first cycle of raising the temperature and lowering the temperature, which is performed once, is very narrow. Thus, it is known that nanoglass is hardly transformed by thermal stress occurred by raising and lowering the temperature in one cycle. Also, a cycle of the internal area (the internal area is a degree of transformation of a material caused by thermal stress) of the hysteresis loop by a second cycle of raising the temperature and lowering the temperature, which are performed twice, is almost similar to the internal area of the hysteresis loop by the cycle of raising the temperature and lowering the temperature, which are performed first. There is no difference in each temperature when comparing stress during the raising, i.e., ramp up of the temperature and lowering of the temperature, and thus, even if the cycle is repeated several times, the initial thermal stress characteristics do not vary much. On the other hand, a conventional CVD oxide layer used as an interlevel dielectric (ILD) layer has the thermal stress characteristics different from FIG. 3A. That is, the conventional CVD oxide layer used as the ILD layer does not form a thermal stress cycle with respect to thermal variation.

Figure 2C:
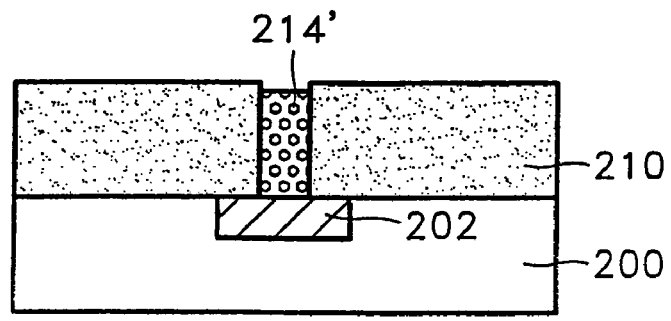

Referring to FIG. 2C, the porous oxide layer 214 formed on the first ILD layer 210 is removed, thereby forming a porous oxide plug 214' for filling only inside the first contact hole 212. This step can also be performed by a chemical mechanical polishing (CMP) process. Alternatively, this step can also be performed by an etch-back process if the strength of the porous oxide layer is not sufficient to withstand the CMP process.

Figure 2D:
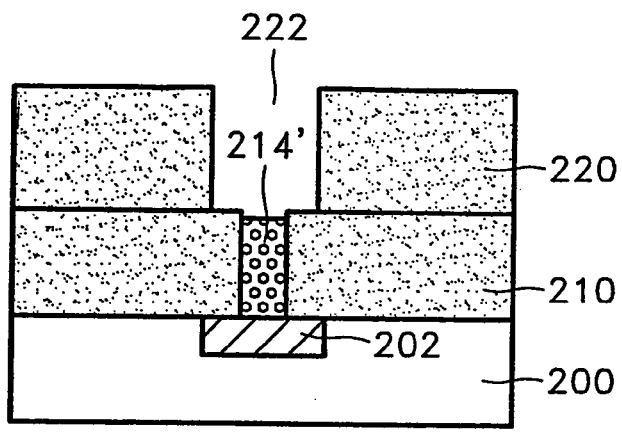

Referring to FIG. 2D, a second ILD layer 220 is formed by the conventional CVD method on a semiconductor substrate 200 having the porous oxide plug 214' formed therein. The second ILD layer 220 is preferably a compact and solid oxide layer such as the first ILD layer 210, as described above. Subsequently, a photoresist pattern (not shown) for opening the porous oxide plug 214' by a conventional photolithography process is formed on the second ILD layer 220, and the second ILD layer 220 is etched to expose the porous oxide plug 214', using the photoresist pattern as an etching mask. Thus, a second contact hole 222 is formed. Here, although not shown, an etch stopper (not shown) having an etch selectivity different from that of the second ILD layer can be interposed between the second ILD layer 220 and the first ILD layer 210. That is, an etch stopper (not shown) having an etch selectivity with respect to the second ILD layer 220 is formed to prevent the lower first ILD layer 210 from being etched together when etching the second ILD layer 220. If the second ILD layer 220 is an oxide layer, a nitride layer is preferably used as the etch stopper (not shown).

Figure 2E:
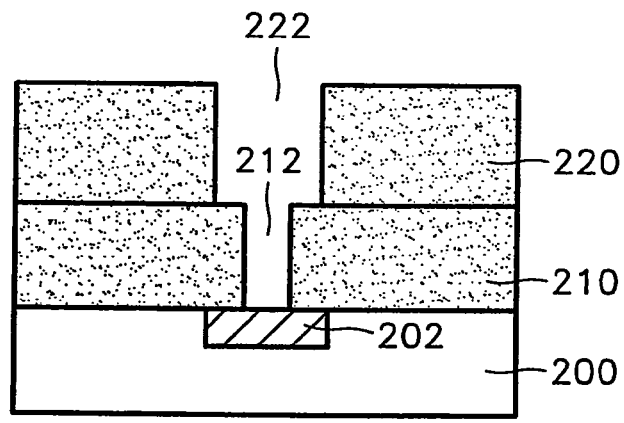

Referring to FIG. 2E, the porous oxide plug 214' formed in the first contact hole 212 is removed. This can be performed by a dry- and wet-etching method. As described with reference to FIG. 2B, due to internal porosity, the etching speed of the porous oxide layers 214 and 214' is faster than that of the first ILD layer 210. Due to these characteristics, only the porous oxide layer can be selectively etched without using an etching mask.

The porous oxide layers 214 and 214' in the above-described embodiment have a high etch selectivity, especially during wet etching. In general, the etching speed of a nanoglass thin film in a LAL 200 solution during wet etching is about 25 k Å/min. Thus, the etching speed of the nanoglass thin film is more than 100 times faster than the etching speed of a conventional oxide layer, i.e., 200 Å/min. The etching speed of the conventional oxide layer is less than 100 Å/min in a hydrofluoric acid (HF) solution diluted in the ratio of 200:1, whereas the etching speed of the nanoglass thin film in accordance with one embodiment is about 850 Å/min.

Thus, even though there is a difference in an etching solution, the porous oxide layers 214 and 214' in this embodiment have a high etch selectivity with respect to a compact ILD layer. Thus, the porous oxide layers can be easily removed in the etching process.

Figure 2F:
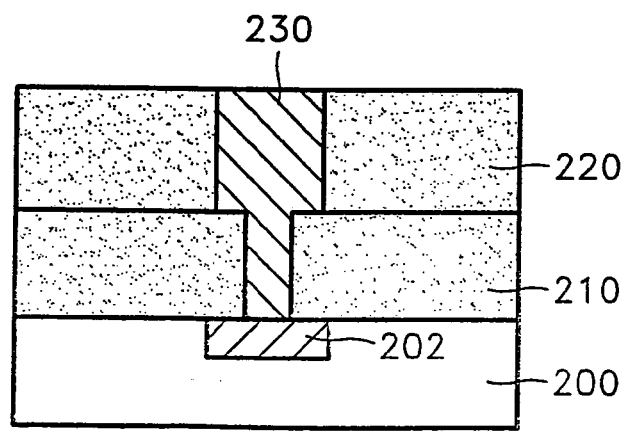

As described above, the porous oxide plug 214' formed in the first contact hole 212 is removed. Then, the first and second contact holes 212 and 222 are filled with a conductive material, as shown in FIG. 2F, thereby forming the contact plug 230. A conductive material such as doped polysilicon, or chemically-vapor-deposited or physically-vapor-deposited aluminum (Al), or tungsten (W), titanium nitride (TiN), or tungsten silicon (WSi) can be used.

The method for forming a contact described in these embodiments can be applied to, for example, a two-step contact hole formation process where it is difficult to form a contact hole in a single step due to the large etching depth or a high aspect ratio, which can cause incomplete formation of the contact hole, or leakage current due to over-etching damage to an opening.

Dopant diffusion occurring between the contact, and the active region 202, e.g., from the active region 202 to the contact, can be prevented while thermally-treating another device (not shown) formed on the semiconductor substrate 200 before forming a second contact hole 222 with the porous oxide layer 214'. In the prior art, the dopant diffusion occurs often because the lower contact plug is formed of a conductive material, e.g., metal, thus providing an ample diffusion path. But the diffusion of the dopants can be prevented with the porous oxide layer in accordance with an embodiment of the present invention. Namely, because the porous oxide plug 214' is not dense, or existing in a glass phase, the porous oxide plug 214' does not provide a diffusion path required for the various diffusion mechanisms such as grain-boundary diffusion or bulk diffusion as in the prior art. Thus, other porous materials may be used instead of a porous oxide layer if they do not provide a diffusion path and have a high etch selectivity with respect to an interlayer dielectric layer as in the above embodiment.

The process of forming a contact in the described embodiment is not limited to a two-step contact formation process but can be easily applied to a three or more step contact formation process, depending on the depth of a contact hole or the specific requirements in processes.

Also, the method for forming a contact in the embodiment is not limited to a contact connected to the active region of the semiconductor substrate but can be applied to various methods for forming a contact of the semiconductor device such as a contact between metal interconnections.

A method for forming a semiconductor device having a contact in a peripheral circuit region of each memory block of a semiconductor memory device in accordance with an embodiment of the present invention will be described with reference to FIGS. 4A through 4F.

Referring to FIG. 4A, a cell region and a peripheral circuit region are defined on a semiconductor substrate 300, and a field oxide layer 310 for electrically isolating active regions 312, 312', 314, and 316 of the semiconductor substrate 300 is formed in each region. The field oxide layer 310 can be formed by a conventional local oxidation of silicon (LOCOS) process, or a shallow trench isolation (STI) process. Subsequently, transistors including a gate electrode 302, a gate dielectric layer 304, and a protective or capping layer 306 are formed on the cell region and on the peripheral circuit region. The protective layer 306 is preferably a nitride layer. Contacts for supplying an electrical signal to the cell region or to the peripheral circuit region will be formed on active regions 314 and 316 defined on the peripheral circuit region, in addition to a transistor for driving a transistor in the cell region. Since the process of forming the transistor is well known, a detailed description will be omitted for brevity.

Referring to FIG. 4B, a bit line contact 322 and a bit line 320, which are connected to a source/drain region 312 of the transistor are formed on the cell region. To facilitate the formation of the bit line 320, bit line contact pads 318 can be formed on the source/drain region 312. Thus, the structure of FIG. 4B can be formed by sequentially forming the contact pads 318, a first interlevel dielectric (ILD) layer 330, the bit line contact 322, and the bit line 320.

To form the contact pads 318, a doped polysilicon layer may be formed on the cell region on which the transistor is formed, and the doped polysilicon layer is planarized by conventional techniques such as a chemical mechanical polishing (CMP) process. Separate contact pads 318 are thereby formed.

Next, the bit line contact 322 is formed on the contact pads 318. Specifically, a first ILD layer 330 is formed overlying the contact pads 318. Then, the first ILD layer 330 is patterned to form a bit line contact hole therein. Subsequently, a conductive material is deposited into the bit line contact hole, thereby forming the bit line contact 322. Particularly, the planarization process is performed on the resulting structure to form a bit line contact plug for filling the bit line contact hole. The first ILD layer 330 is formed of a solid and compact oxide layer, as described in the above described embodiment. Next, a conductive layer for a bit line, for example, tungsten (W), is deposited on the bit line contact 322 and is patterned, thereby forming the bit line 320.

Figure 4C:
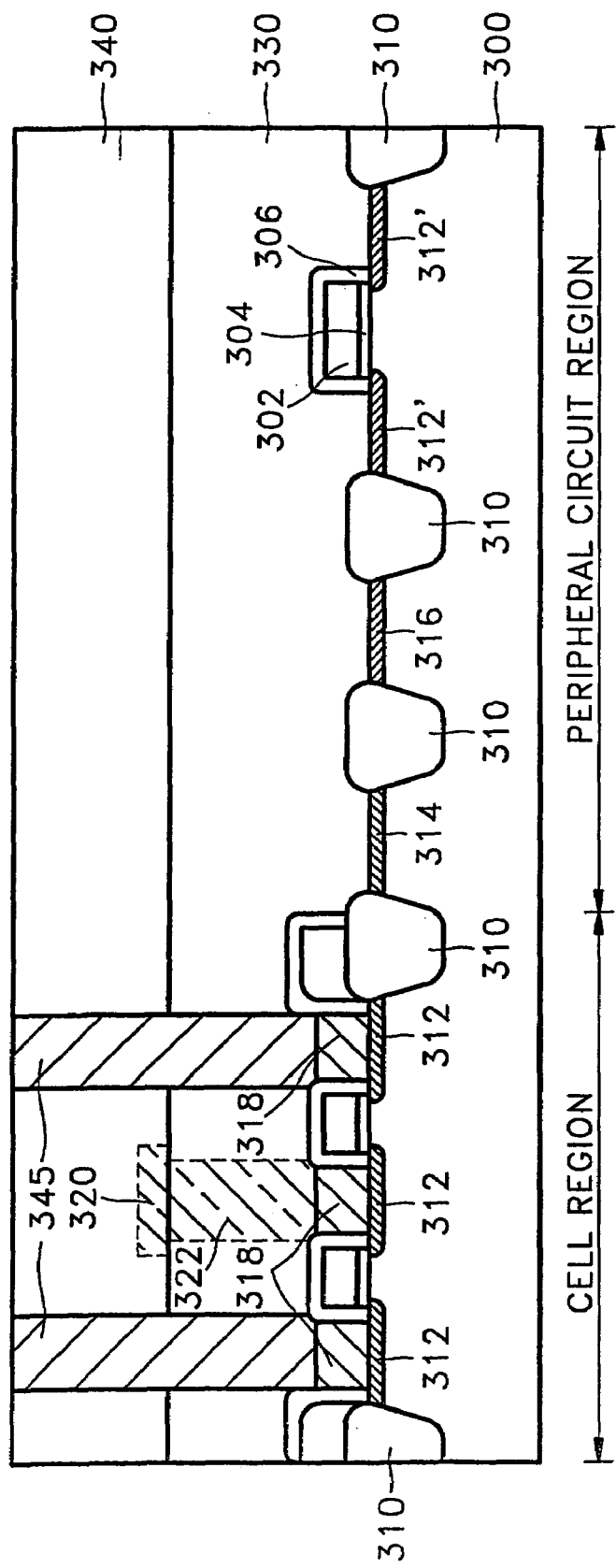

Referring to FIG. 4C, a contact for forming a capacitor is formed on the contact pads of the cell region. The processing step is similar to the step for forming the bit line contact 322. Specifically, a second ILD layer 340 is formed on the first ILD layer 330 on which the bit line 320 is formed. The second ILD layer 340 is formed of a solid and compact (dense) layer preferably using the same methods used to form the first ILD layer 330. Next, the second ILD layer 340 is patterned to form a contact hole therein. Next, a doped polysilicon layer is formed on the semiconductor substrate 300 including the contact hole, and the polysilicon layer (not shown) formed on the second ILD layer 340 is planarized by a CMP process, thereby forming a contact plug 345 in the contact hole.

Figure 4D:
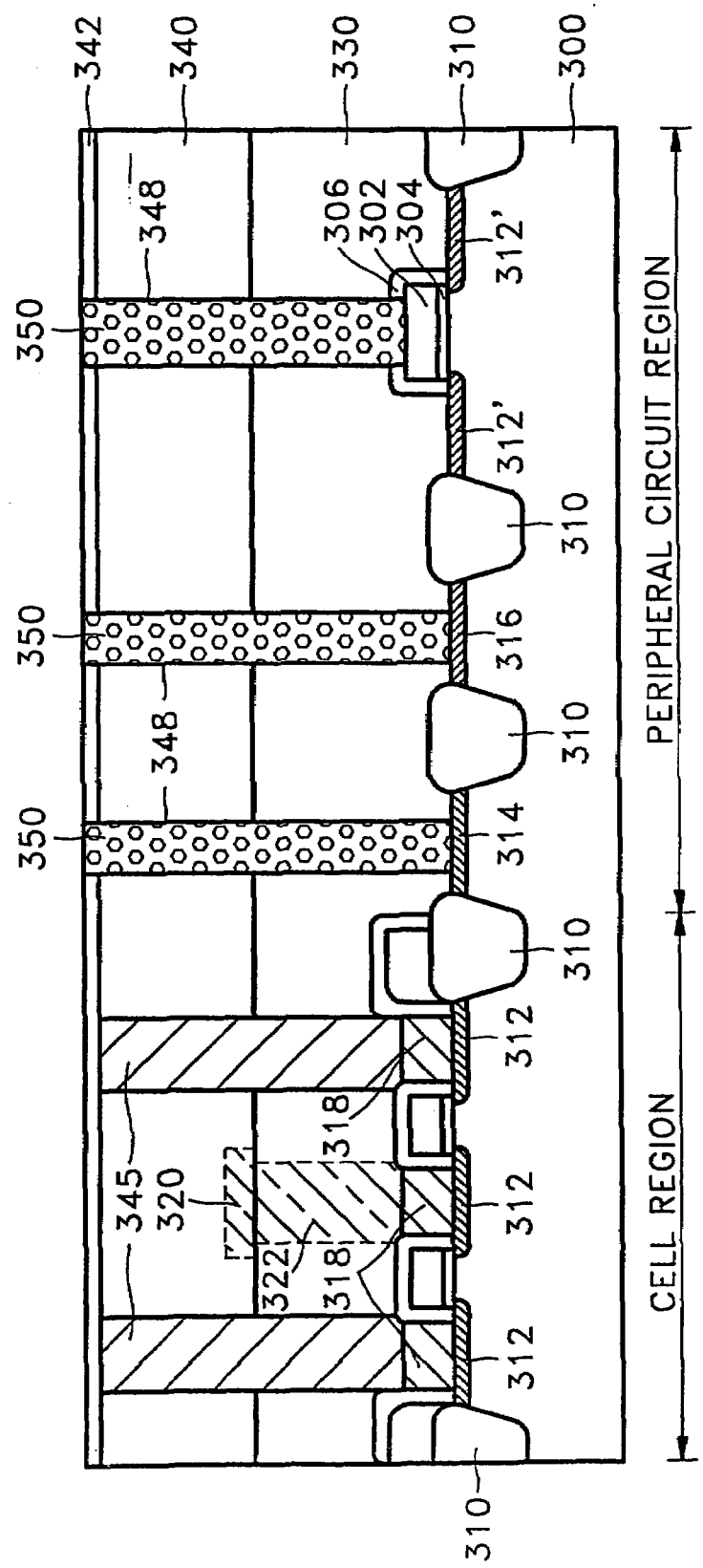

Referring to FIG. 4D, a porous plug such as a porous oxide plug 350 is formed where a contact for the peripheral circuit region is to be formed. This processing step is performed by the same or similar method as the processing steps for forming a porous oxide plug (214' of FIG. 2) with reference to FIGS. 2A through 2C. That is, the second ILD layer 340 and the first ILD layer 330 are etched to form a first contact hole 348 to expose the active regions 314 and 316 of the peripheral circuit region and the gate conductive layer 302 of the transistor, respectively. This exposing step can be performed by the conventional photolithography and etching process. That is, a photoresist pattern (not shown) is formed on the second ILD layer 340, and the first and second ILD layers 330 and 340 are etched by using the photoresist pattern as an etching mask, thereby forming the first contact hole 348. Preferably, etching is performed by RIE such that the first and second ILD layers 330 and 340 and the protective layer 306 of the gate conductive layer 302 of the transistor formed on the peripheral circuit region have a high etch selectivity with respect to the active regions 314, and 316 of the semiconductor substrate 300. That is, in general, the active regions 314, and 316 to be exposed are doped silicon, and the first and second ILD layers 330 and 340, and the protective layer 306 are oxide and silicon nitride layers, respectively. Thus, the active regions 314, and 316 become etching end points.

Subsequently, the first contact hole 348 is filled with a porous layer such as a porous oxide layer, thereby forming the porous oxide plug 350. The oxide layer is formed of the same or similar material and by the same or similar method as in the embodiment described above.

A silicon nitride layer 342 can be formed on the second ILD layer 340, as an etch stopper in the subsequent step of forming a capacitor of the cell region and during forming of a second contact hole over the first contact hole 348.

Referring to FIG. 4E, a cylinder or other type capacitor 360 is formed on the contact 345 and the second ILD layer 340, which are formed on the cell region. The processing steps for forming the cylinder-type capacitor 360 are well known. Thus, a detailed description thereof will be omitted.

Referring back to FIG. 4E, a third ILD layer 370 is deposited on the semiconductor substrate 300 on which the capacitor 360 is formed. Then, the third ILD layer 370 is planarized by a CMP process. Subsequently, the third ILD layer 370 of the peripheral circuit region is etched to form a second contact hole 365 connected to the first contact hole 348 formed under the second contact hole 365.

After forming the second contact hole 365, the porous oxide plug 350 formed in the first contact hole 348 is removed by etching. This process can be preferably performed by dry etching or wet etching as in the above embodiment.

Figure 4F:
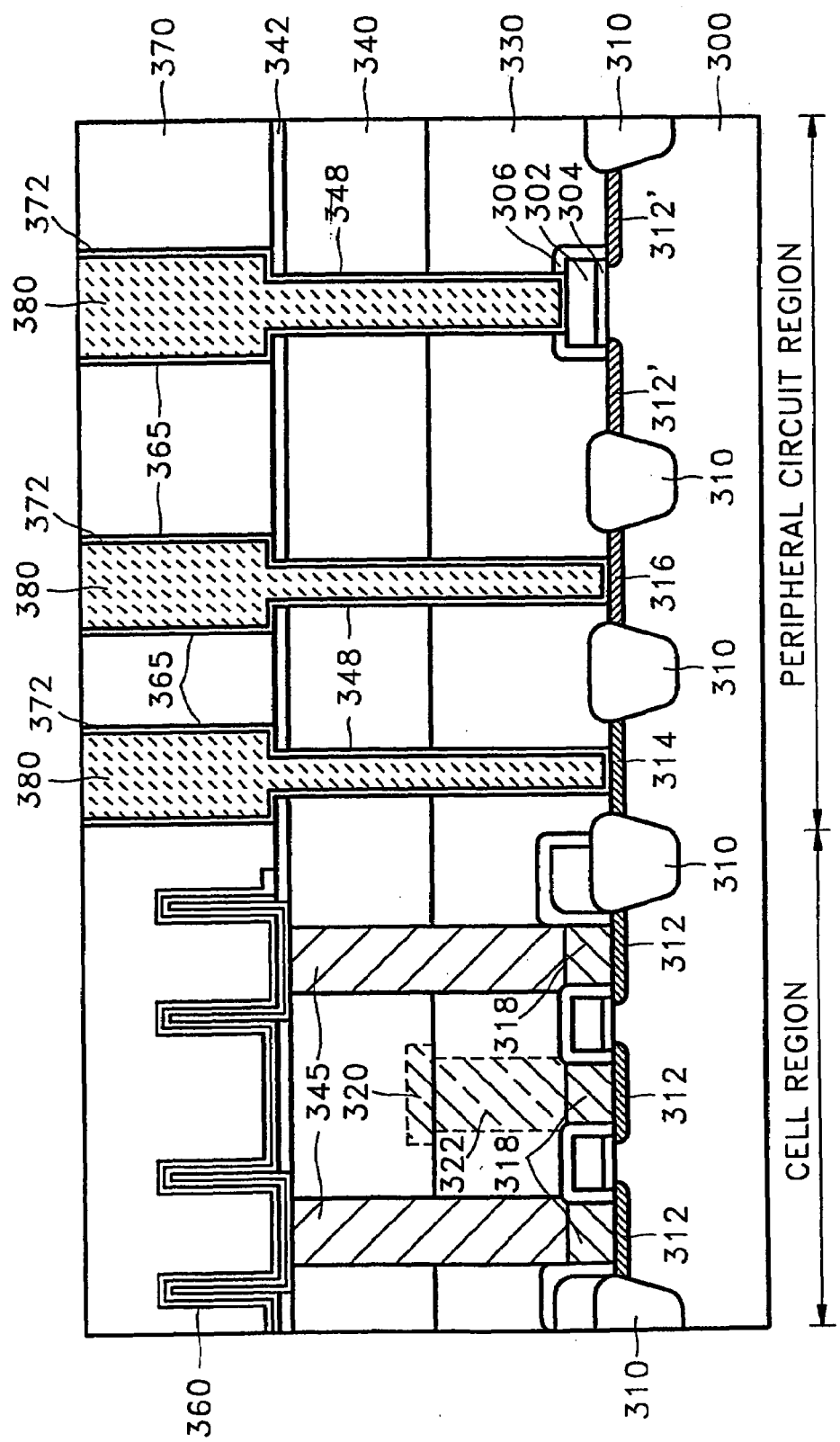

Referring to FIG. 4F, a contact 380 is formed in the first contact hole 348 from which the porous oxide plug 350 is removed and the second contact hole 365. More specifically, an ohmic layer/diffusion barrier layer 372 is formed before forming the contact 380 to form ohmic contacts between the contact 380 and the active regions 314 and 316 or between the contact 380 and the gate conductive layer 302. Silicides of metals such as titanium (Ti), tantalum (Ta), tungsten (W), cobalt (Co), and nickel (Ni) can be used as the ohmic layer, and the diffusion barrier layer can be formed of nitrides of the metals described above.

Subsequently, the first and second contact holes 348 and 365, on which the ohmic layer/diffusion barrier layer 372 is formed, are filled with a conductive material such as aluminum (Al) or tungsten (W), thereby forming the contact 380 for electrically connecting the active regions 314 and 316 and the gate conductive layer 302 of the semiconductor substrate 300 formed on the peripheral circuit region.

During formation of the semiconductor device, several thermal processes are performed. The thermal processes include a thermal treatment process of diffusing impurities in doped polysilicon when forming the bit line contact 322 and the contact 345 for a capacitor, and a process of forming a capacitor dielectric layer for the capacitor 360. The thermal treatment process of diffusing impurities is performed at a temperature of about 800–850° C. The thermal process for forming a capacitor dielectric layer is performed by a thermal treatment at a temperature of several hundreds ° C. for a relatively long processing time, depending on the types of capacitor dielectric layers chosen. With an embodiment of the present invention, during these thermal processes, the active regions 314 and 316 and the gate conductive layer 302 contact the porous oxide layer, thereby preventing the diffusion of the impurities (especially, p-type impurities) therefrom.

According to yet another embodiment, another method for forming a semiconductor device having a contact in a peripheral circuit region of each memory block of a semiconductor memory device using the method of the above described embodiment will be described with reference to FIGS. 5A through 5D. Hereinafter, the same reference numerals as those in FIGS. 4A through 4F refer to the same elements throughout the drawings.

The same or similar method and material as with the immediately above embodiment is used, up to the formation of the bit line 320 described with reference to FIGS. 4A through 4B. Thus, the description thereof will be omitted.

Figure 5A:
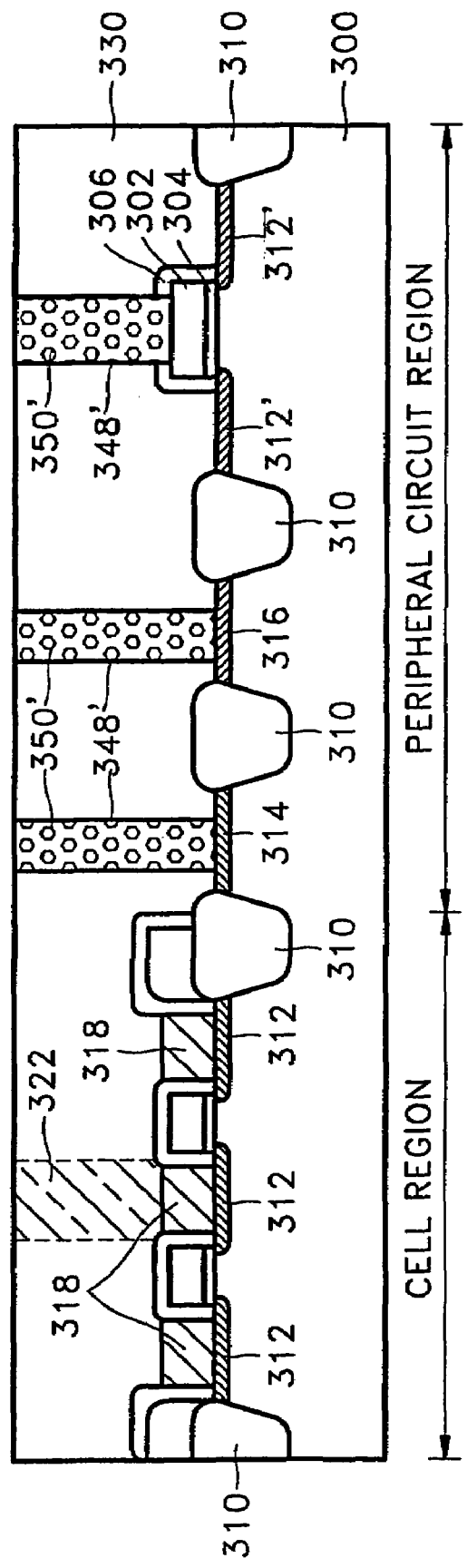
FIGS. 5A through 5D are sectional views illustrating a method for forming a semiconductor device using the method for forming a contact, according to yet another embodiment of the present invention.

Referring to FIG. 5A, after a bit line contact 322 is formed on contact pads 318 of a cell region, a first ILD layer 330 of a peripheral circuit region is etched to form a first contact hole 348¢ for opening active regions 314 and 316 and a gate conductive layer 302 on a semiconductor substrate 300. Subsequently, the first contact hole 348' is filled with a porous oxide layer having a high etch selectivity with respect to the first ILD layer 330, thereby forming a porous oxide plug 350'. Here, the method for forming the contact hole and the method for forming the porous oxide layer are the same as that of the immediately above described embodiment.

Figure 5B:
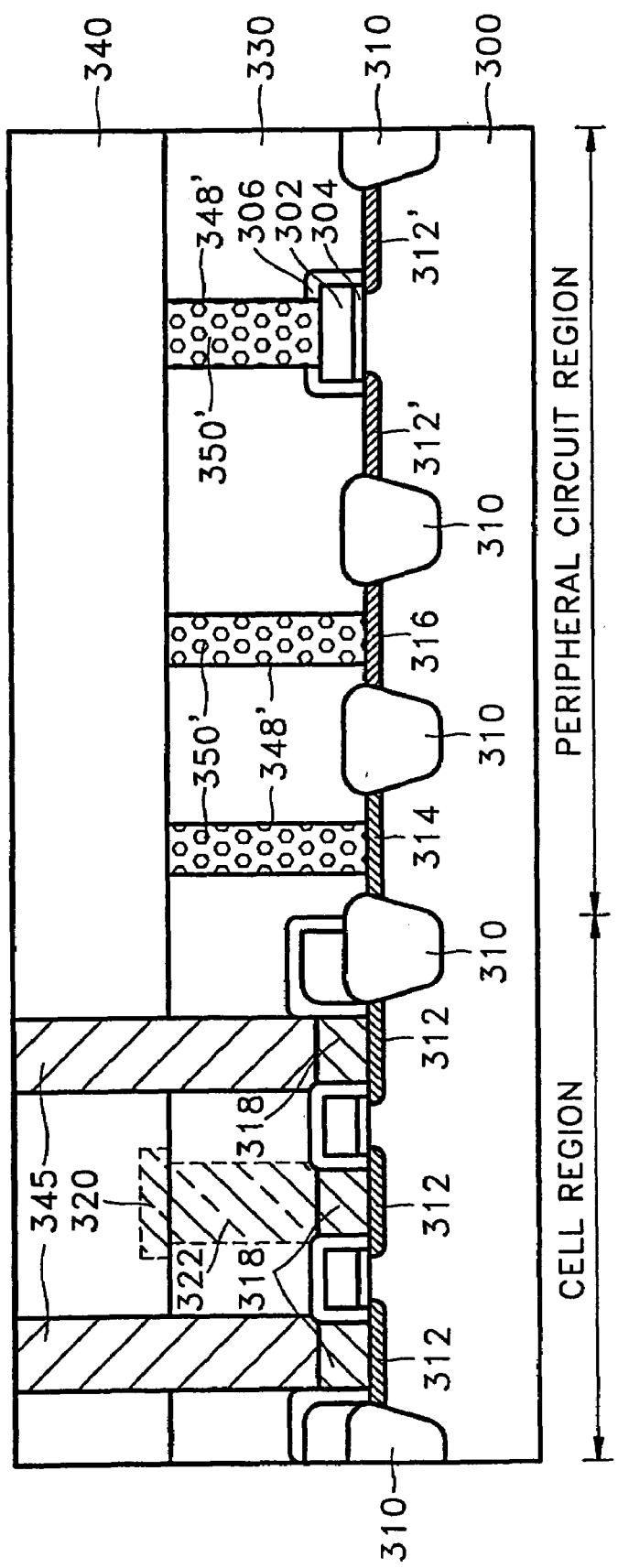

Referring to FIG. 5B, a bit line 320 is formed on the bit line contact 322 on the cell region. Subsequently, a second ILD layer 340 is formed overlying the bit line 320. Then, the second and first ILD layers 340 and 330 on the cell region are etched, thereby forming a contact for a capacitor connected to contact pads 318 of the cell transistor. The layers used for this embodiment are the same as those of the embodiment described with reference to FIG. 2C.

Figure 5C:
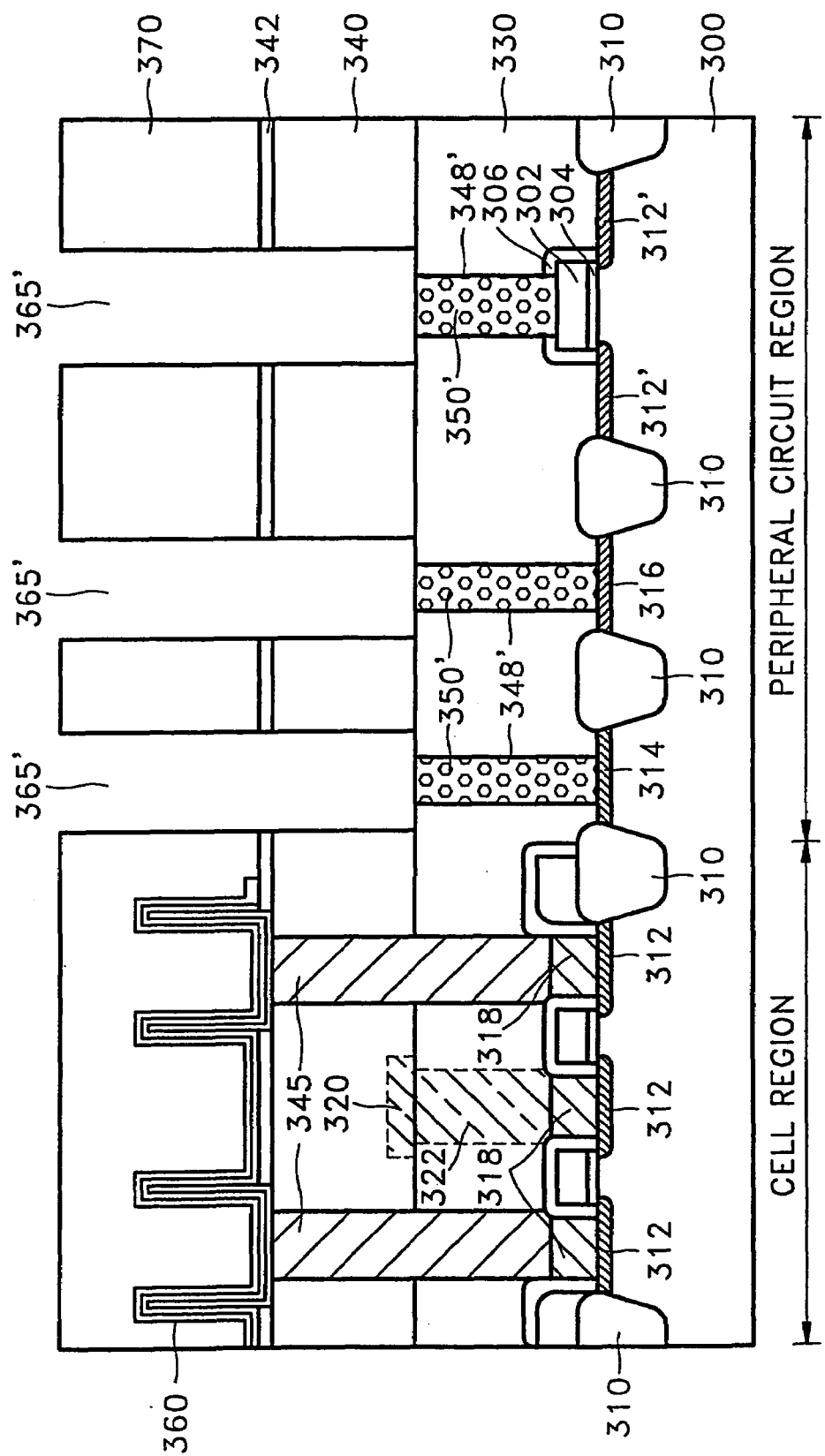

Referring to FIG. 5C, a capacitor 360 is formed on the second ILD layer 340 on the cell region. A silicon nitride layer 342 can be interposed as an etch stopper between the capacitor 360 and the second ILD layer 340. Next, a third ILD layer 370 is formed on the resultant structure. Then, the third ILD layer 370 and the second ILD layer 340 are etched on the peripheral circuit region, thereby forming a second contact hole 365' over first contact hole 348'. A porous oxide plug 350' formed in the first contact hole 348', which is exposed through the second contact hole 365', is removed by dry etching or wet etching. The layers used for this process are the same as those of the embodiment described with reference to FIGS. 4E and 4F.

Figure 5D:
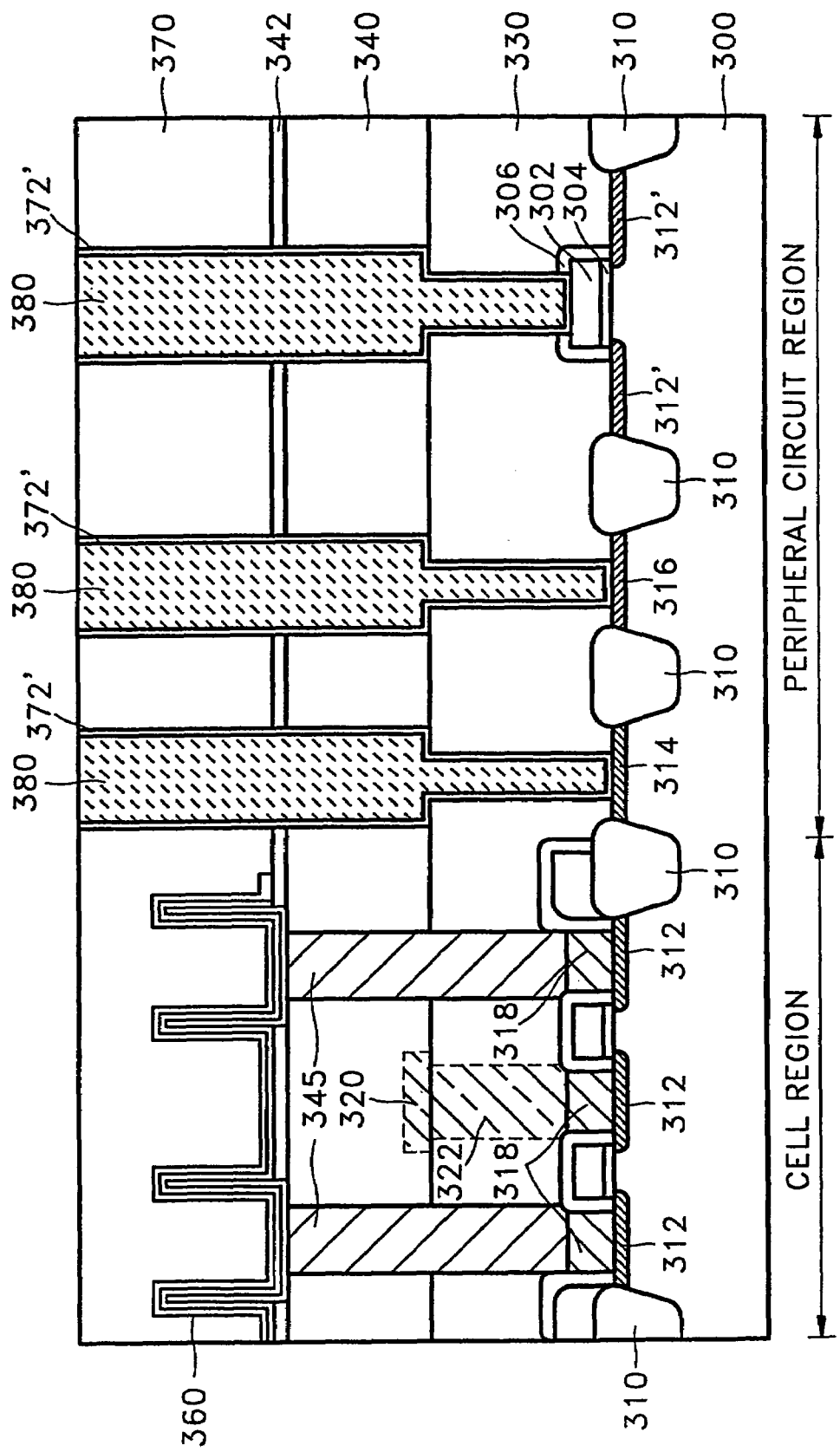

Referring to FIG. 5D, a contact plug 380' is formed by filling the first and second contact holes 348' and 365', which are formed within the second and third ILD layers 340 and 370 of the peripheral circuit region, with a conductive material. The conductive materials are the same as those described with reference to FIG. 4F. Similarly, the ohmic layer/barrier metal layer 372' can be additionally formed before forming the conductive material.

This embodiment is different from the immediately above embodiment in that the first contact hole is formed during the formation of the bit line contact 322. However, also with this embodiment, impurity regions 314, 316, and 302 of the peripheral circuit region do not contact metal, and are blocked by the porous oxide plug 350'. Thus, degradation of the electrical characteristics caused by diffusion of dopants from the active regions 314, and 316 during various thermal processes such as one during forming the bit line contact 322 of the cell region, one during forming the contact 345, and one during a thermal process for forming the capacitor 360 can be prevented.

Using these embodiments of the present invention, during forming a contact on the active region to be connected with interconnections, the active region can be protected using a porous plug such as a porous oxide plug. Thus, deterioration of the electrical characteristics caused by dopant diffusion during various thermal and contact formation processes can be prevented.

Also, during forming a contact on the peripheral circuit region of the semiconductor memory device, a contact portion is protected using a porous plug such as a porous oxide plug. Thus, the deterioration of the active regions of the peripheral circuit region and the gate conductive layer, caused by high temperature thermal process such as a thermal process for diffusing impurities during the formation of a contact or a capacitor dielectric layer can be prevented.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for forming a semiconductor device, comprising:
   forming an isolation layer that defines active regions on a semiconductor substrate having a cell region and a peripheral circuit region,
   forming a transistor on the active regions of the cell region and the peripheral circuit region;
   forming a first interlevel dielectric (ILD) layer overlying the transistor;
   forming a bit line and a bit line contact connected to a source or drain region of the transistor formed on the cell region through the first ILD layer;
   forming a second ILD layer overlying the bit line;
   forming a contact for a capacitor electrode connected to the source or drain region of the transistor formed on the cell region through the first and second ILD layers;
   forming a first contact hole to expose the active region of the peripheral circuit region or a gate electrode of the transistor through the first and second ILD layers; and
   filling the first contact hole with a porous layer having a high etch selectivity with respect to the first and second ILD layers.

2. The method of claim 1, further comprising:
   forming a capacitor connected to the contact for a capacitor electrode on the second ILD layer of the cell region;
   forming a third ILD layer overlying the capacitor;
   forming a second contact hole overlying the first contact hole of the peripheral circuit region through the third ILD layer of the peripheral circuit region;
   removing the porous layer in the first contact hole; and
   filling the exposed first and second contact holes with a conductive material to form a contact on the peripheral circuit region.

3. The method of claim 2, wherein the porous layer is formed of oxide.

4. The method of claim 3, wherein the porous oxide layer is formed by a chemical vapor deposition (CVD) method.

5. The method of claim 3, wherein the porous oxide layer is a glass oxide layer formed by a spin on glass (SOG) method.

6. The method of claim 3, wherein the porous oxide layer is removed by wet etching during removing the porous oxide layer.

7. The method of claim 3, before forming the contact plug, further comprising forming an ohmic layer/diffusion barrier layer in the first contact hole and the second contact hole.

8. The method of claim 2, after forming the second ILD layer, further comprising forming an etch stopper on the second ILD layer.

9. The method of claim 2, wherein the etch selectivity of the porous oxide layer with respect to the first, second, and third ILD layers is greater than 5.

10. The method of claim 2, wherein the first, second, and third ILD layers are high-density plasma (HDP) layers, plasma enhanced tetraethylorthosilicate (PE-TEOS) layers, or undoped silicate glass (USG) layers.

11. A method for forming a semiconductor device, comprising:
    forming a transistor on active regions of a cell region and a peripheral circuit region of a semiconductor substrate;
    forming a first interlevel dielectric (ILD) layer overlying the transistor;
    forming a bit line contact connected to a source or drain region of the transistor formed on the cell region through the first ILD layer;
    forming a first contact hole to expose the active region of the peripheral circuit region or a gate electrode of the transistor through the first ILD layer; and
    filling the first contact hole with a porous layer having a high etch selectivity with respect to the first ILD layer.

12. The method of claim 11, further comprising:
    forming a bit line connected to the bit line contact on the cell region;
    forming a second ILD layer overlying the bit line;
    forming a contact for a capacitor connected to the source or drain region of the cell region through the first and second ILD layers;
    forming a capacitor connected to the contact for forming a capacitor on the cell region;
    forming a third ILD layer overlying the capacitor;
    forming a second contact hole overlying the first contact hole on the peripheral circuit region through the second and third ILD layers of the peripheral circuit region;
    removing the porous layer in the first contact hole; and filling the first and second contact holes with a conductive material to form a contact on the peripheral circuit region.

13. The method of claim 11, wherein the porous layer is formed of oxide.

14. The method of claim 13, wherein the porous oxide layer is formed by a chemical vapor deposition (CVD) method.

15. The method of claim 14, wherein tetramethyl silane (TMS), tetrafluoro silane, trimethylfluoro silane, or dimethyldifluoro silane is used as a source gas, and oxygen (O2) and hydrogen (H2) are used as a reactive gas, in the CVD method.

16. The method of claim 14, wherein the CVD method is performed at a pressure of 0.1–10 Torr, a temperature of 50–600° C., and a radio frequency (RE) power of 50–700 W.

17. The method of claim 14, wherein the porous oxide layer is formed of a material selected from the group consisting of $SiO_2$, SiOF, SiOC, and SiOCH.

18. The method of claim 14, wherein the porous oxide layer is formed of xerogel, or aerogel.

19. The method of claim 13, wherein the porous oxide layer is a glass oxide layer formed by a spin on glass (SOG) method.

20. The method of claim 19, wherein the porous oxide layer is thermally treated at a temperature of 200–1000° C.

21. The method of claim 19, wherein the porous oxide layer is formed of a material selected from the group consisting of $SiO_2$, SiOC, and SiOCH.

22. The method of claim 19, wherein the porous oxide layer is formed of xerogel, or aerogel.

23. The method of claim 11, wherein removing the porous layer comprises wet etching.

24. The method of claim 23, wherein a wet etchant used in the wet etching is a LAL solution or a hydrofluoric acid (HF) solution.

25. The method of claim 11, before forming the contact plug, further comprising forming an ohmic layer/diffusion barrier layer in the first contact hole and the second contact hole.

26. The method of claim 25, wherein the ohmic layer/diffusion barrier layer is formed of a metal selected from the group consisting of titanium (Ti), tantalum (Ta), cobalt (Co), nickel (Ni), or tungsten (W), and nitride of the metal, respectively.

27. The method of claim 11, after forming the second ILD layer, further comprising forming an etch stopper on the second ILD layer.

28. The method of claim 27, wherein the etch stopper is a silicon nitride (SiN) layer.

29. The method of claim 11, wherein the etch selectivity of the porous layer with respect to the first, second, and third ILD layers is greater than 5.

30. The method of claim 11, wherein the first, second, and third ILD layers are high-density plasma (HDP) layers, plasma enhanced tetraethylorthosilicate (PE-TEOS) layers, or undoped silicate glass (USG) layers.

* * * * *

UNITED STATES PATENT AND TRADEMARK OFFICE
CERTIFICATE OF CORRECTION

| | |
|---|---|
| PATENT NO. | : 7,087,519 B2 |
| APPLICATION NO. | : 10/895190 |
| DATED | : August 8, 2006 |
| INVENTOR(S) | : Hee-Sook Park |

Page 1 of 1

It is certified that error appears in the above-identified patent and that said Letters Patent is hereby corrected as shown below:

Column 13, line 16, the word "(RE)" should read -- (RF) --.

Signed and Sealed this

Twenty-eighth Day of July, 2009

JOHN DOLL
*Acting Director of the United States Patent and Trademark Office*